United States Patent
Randazzo et al.

(12) 
(10) Patent No.: US 6,211,555 B1
(45) Date of Patent: Apr. 3, 2001

(54) SEMICONDUCTOR DEVICE WITH A PAIR OF TRANSISTORS HAVING DUAL WORK FUNCTION GATE ELECTRODES

(75) Inventors: Todd A. Randazzo; Jan Kolnik, both of Colorado Springs, CO (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/162,407

(22) Filed: Sep. 29, 1998

(51) Int. Cl.[7] ................................................ H01L 29/76
(52) U.S. Cl. ........................ 257/368; 257/407; 257/413
(58) Field of Search ................................. 257/368, 407, 257/413

(56) References Cited

U.S. PATENT DOCUMENTS

| | | | |
|---|---|---|---|
| 4,205,342 | 5/1980 | Darwish et al. | 357/23 |
| 4,327,320 | 4/1982 | Oguey et al. | 323/313 |
| 4,464,588 | 8/1984 | Wieser | 307/297 |
| 4,559,694 | * 12/1985 | Yoh et al. | 257/369 |
| 4,714,519 | 12/1987 | Pfiester | 437/81 |
| 4,745,079 | 5/1988 | Pfiester | 437/29 |
| 5,027,185 | * 6/1991 | Liauh | 257/384 |
| 5,432,432 | 7/1995 | Kimura | 323/313 |
| 5,467,052 | 11/1995 | Tsukada | 327/543 |
| 5,610,537 | 3/1997 | Hastings | 326/59 |

OTHER PUBLICATIONS

MOS Voltage Reference Based on Polysilicon Gate Work Function Difference; Henri J. Oguey et al.; IEEE Journal of Solid State Circuits; vol. 15, Issue 3; Jun., 1980; pp. 264–269.

An Investigation of the Manufacture and Characterisation of Enhancement–Type Buried Channel M.O.S. Transistors; Fearghal John Morgan; Oct. 1986; Department of Electrical and Electronic Engineering The Queen's University of Belfast.

* cited by examiner

*Primary Examiner*—Mark V. Prenty

(57) ABSTRACT

Techniques are described for fabricating a pair of β-identical transistors, in other words, a pair of transistors whose dimensions and electrical characteristics, other than their respective gate electrode work functions, are substantially similar. In particular, the lengths of respective channel regions for the transistors are substantially the same, and portions of each gate electrode extending above a channel region include only dopants of a single conductivity type. The techniques can be incorporated into a standard CMOS process.

24 Claims, 13 Drawing Sheets

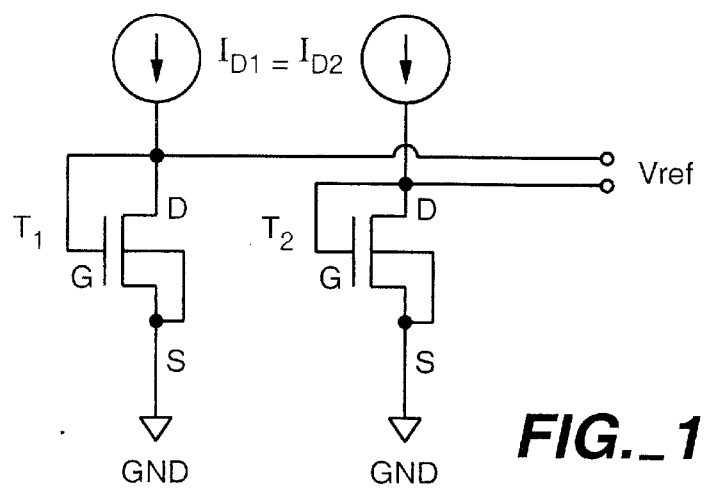
FIG._1
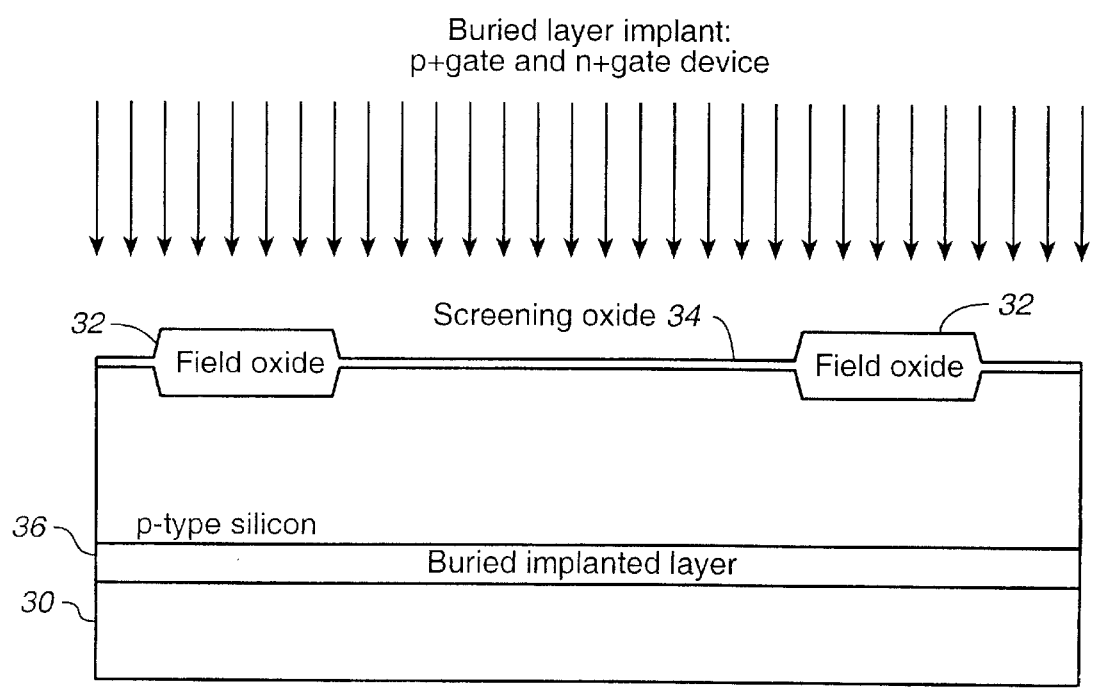
FIG._2

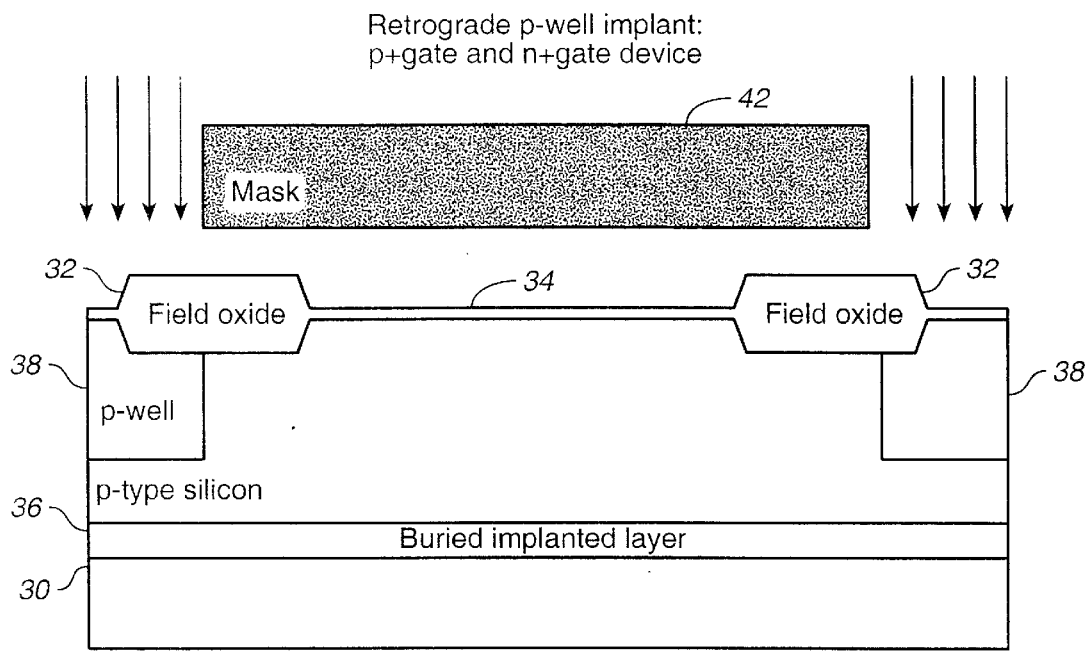
FIG._3
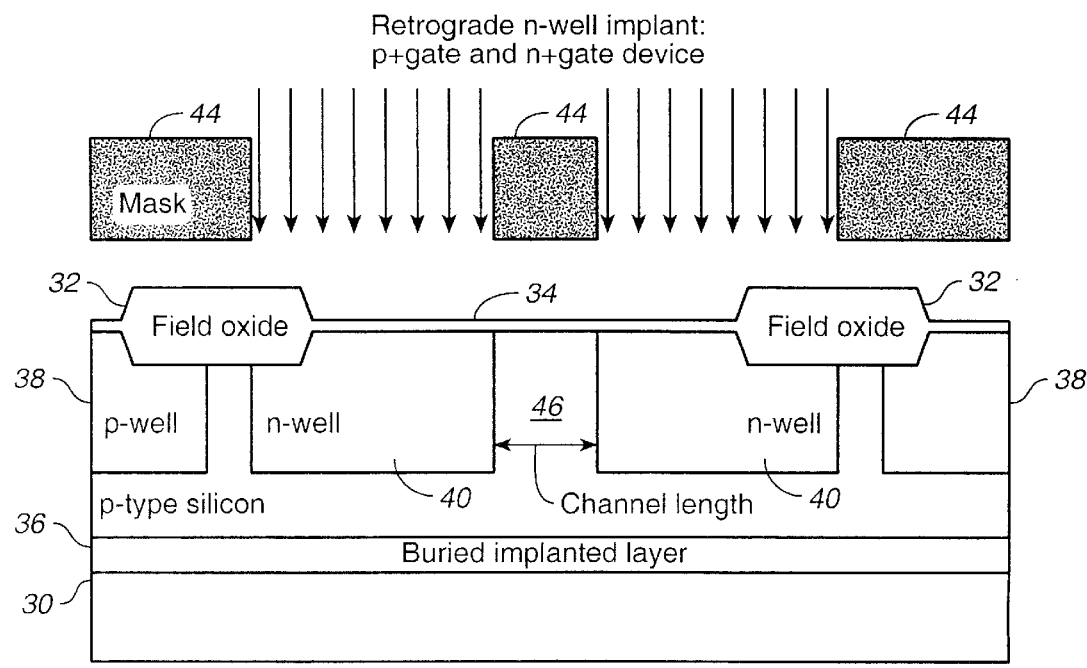
FIG._4

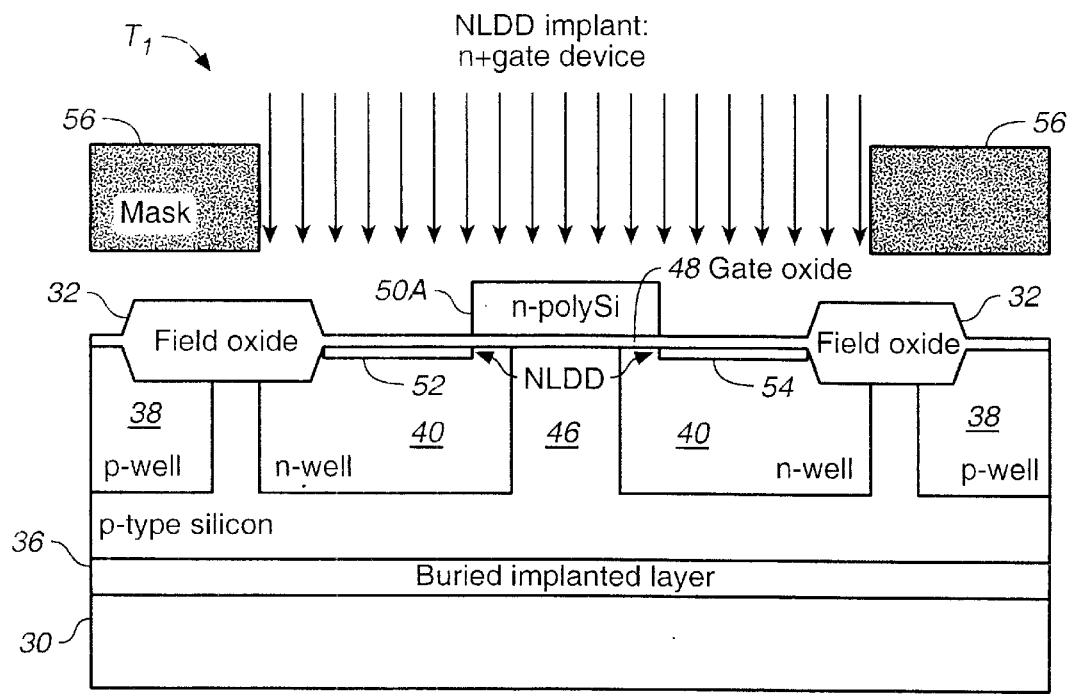
FIG._5A
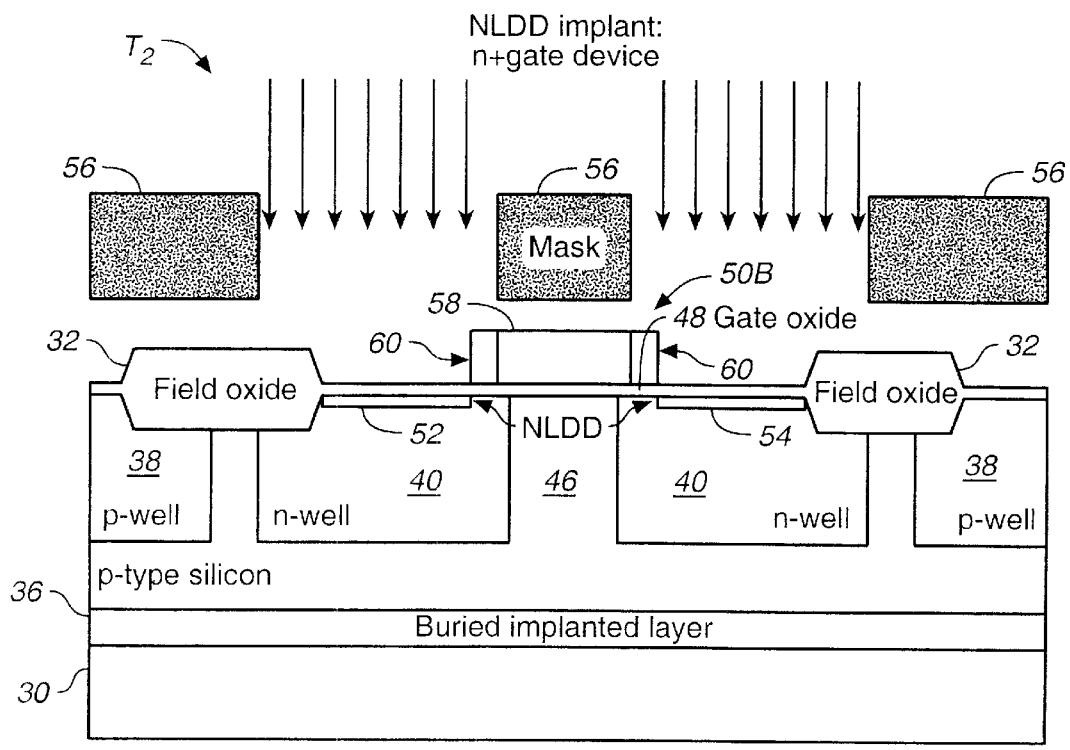
FIG._5B

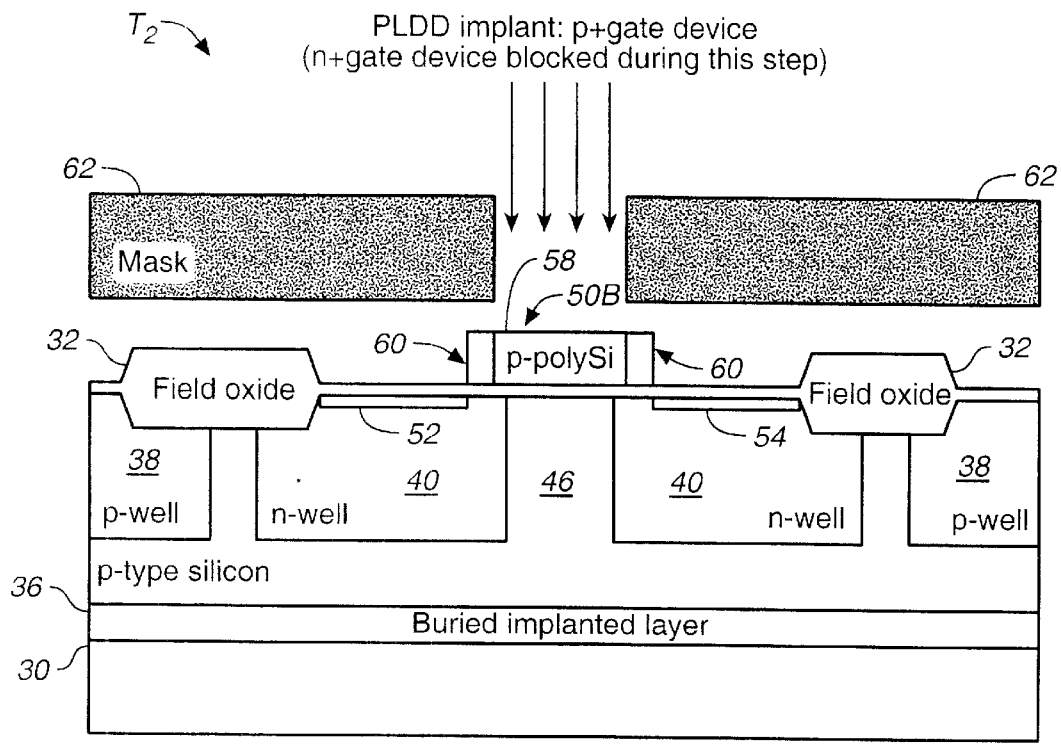
*FIG._6*
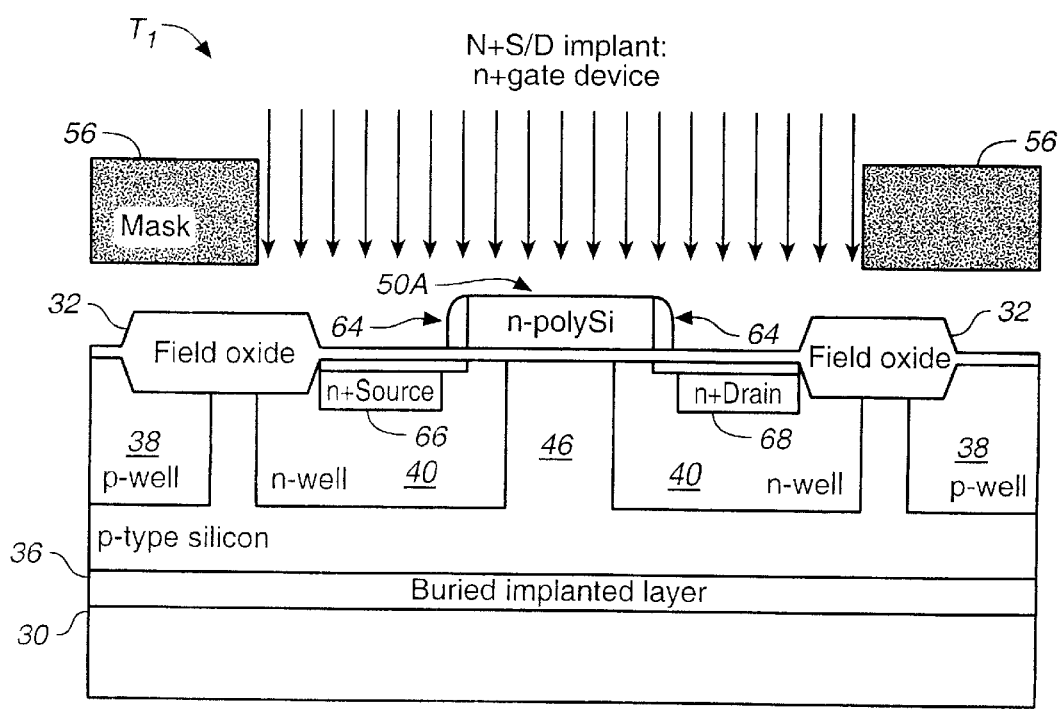
*FIG._7A*

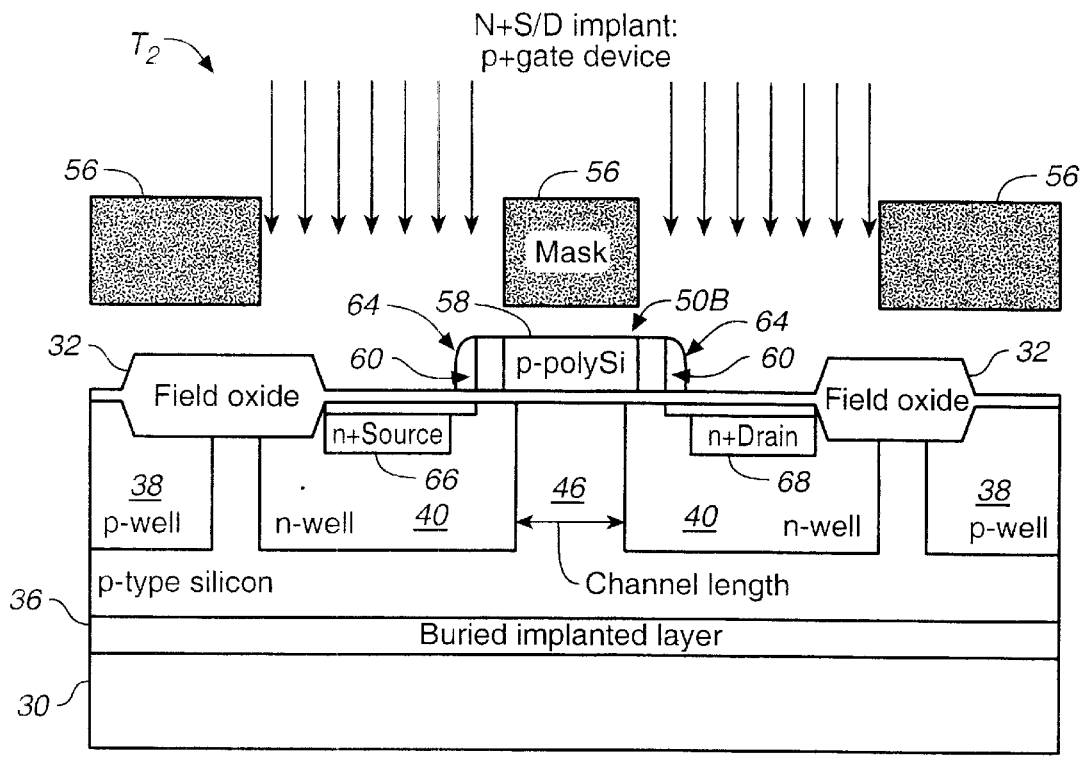
FIG._7B
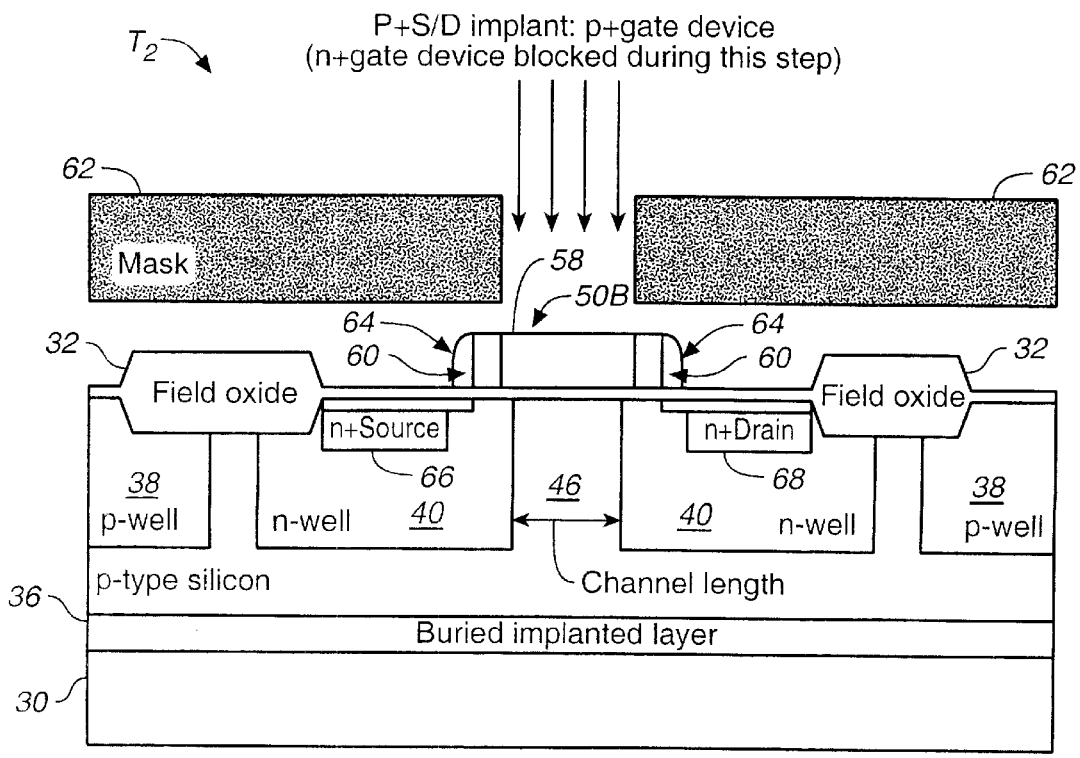
FIG._8

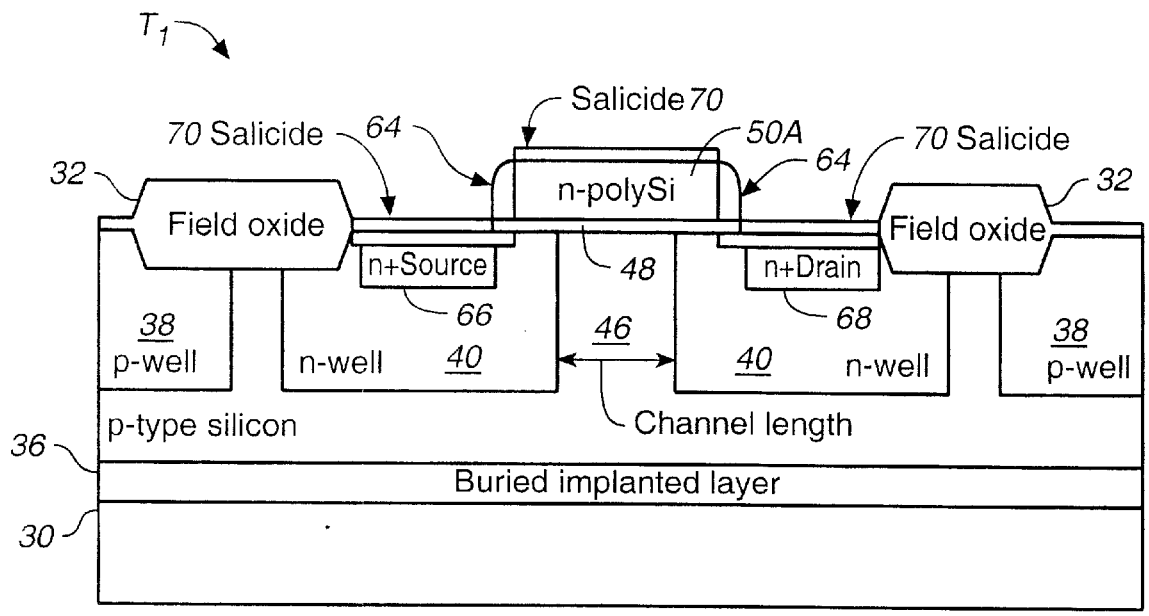
FIG._9A
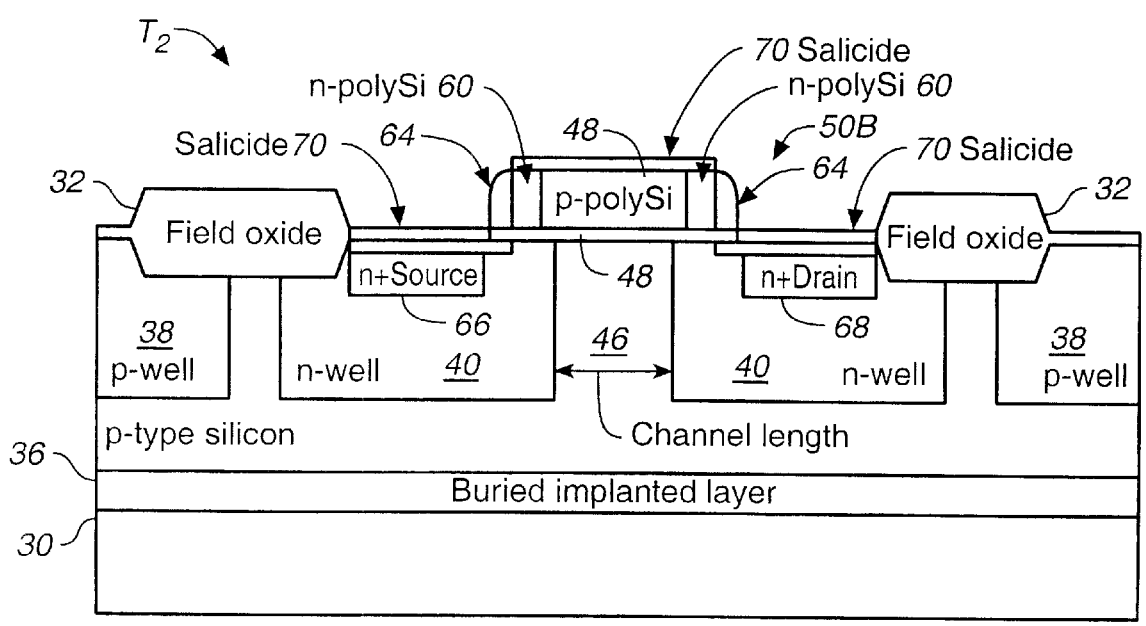
FIG._9B

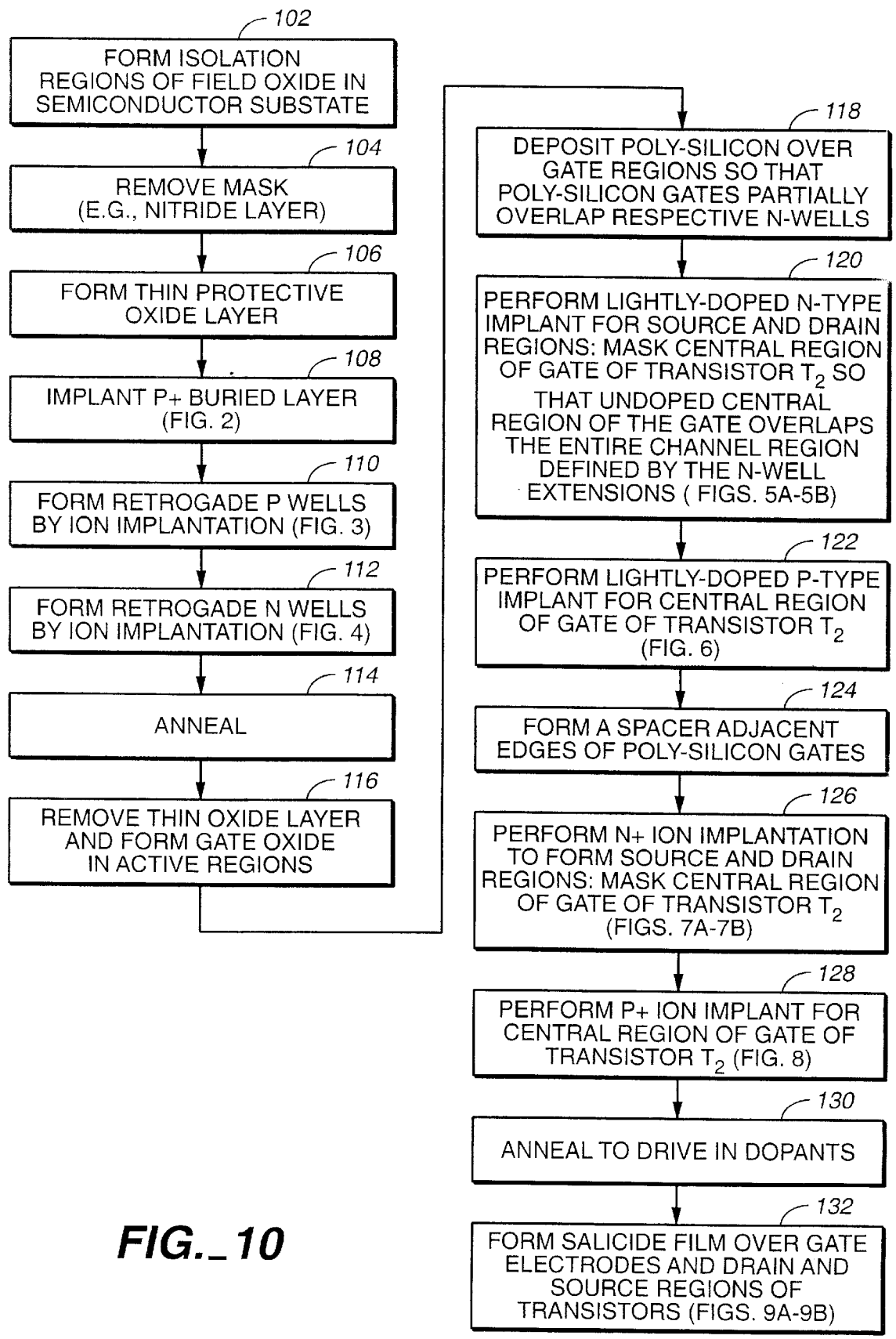
FIG._10

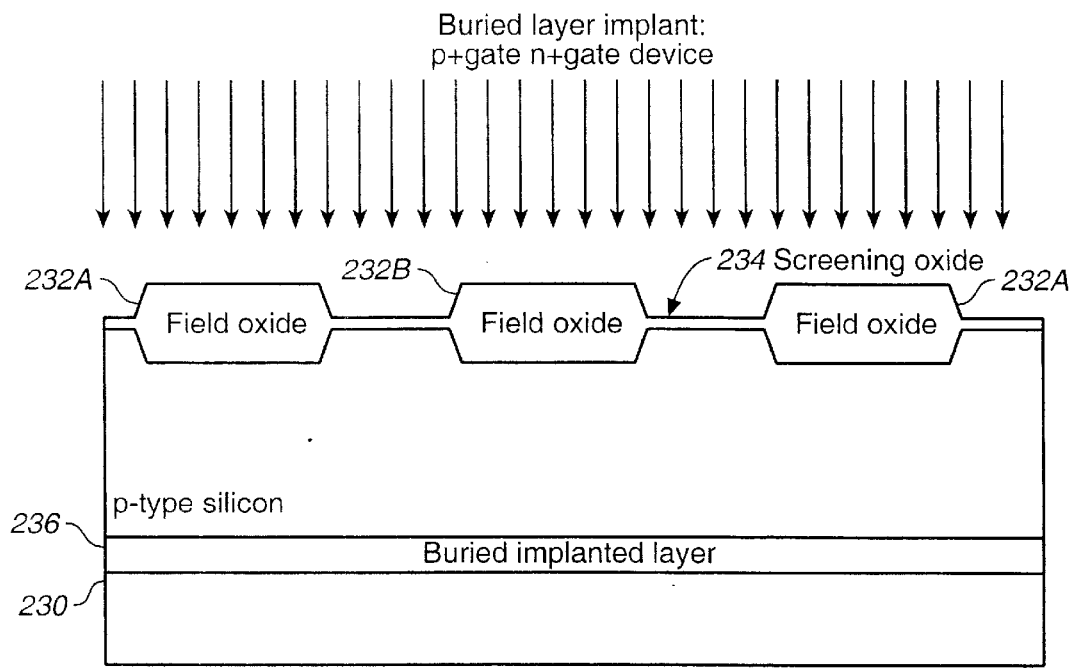
FIG._11
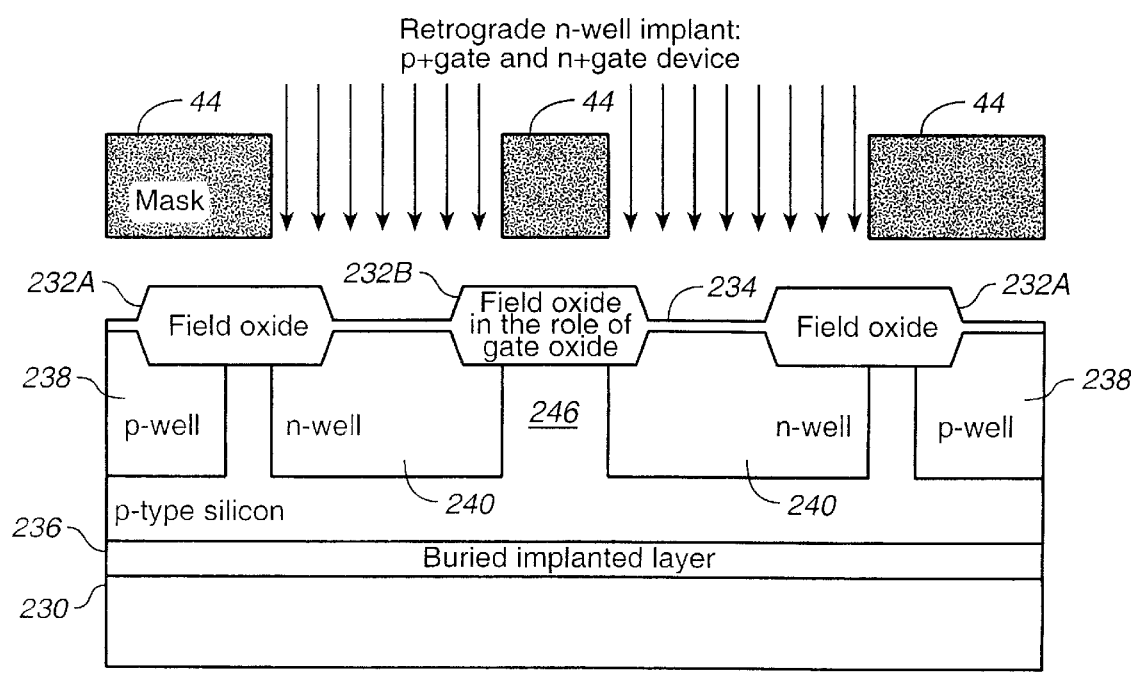
FIG._12

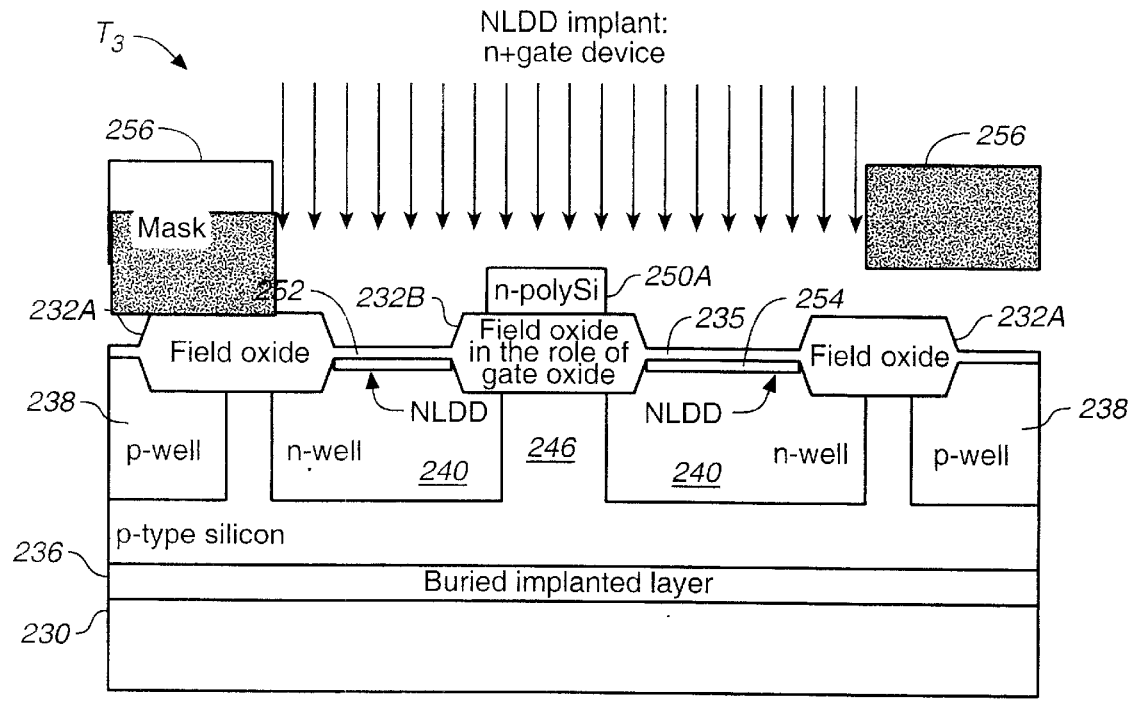
FIG._13A
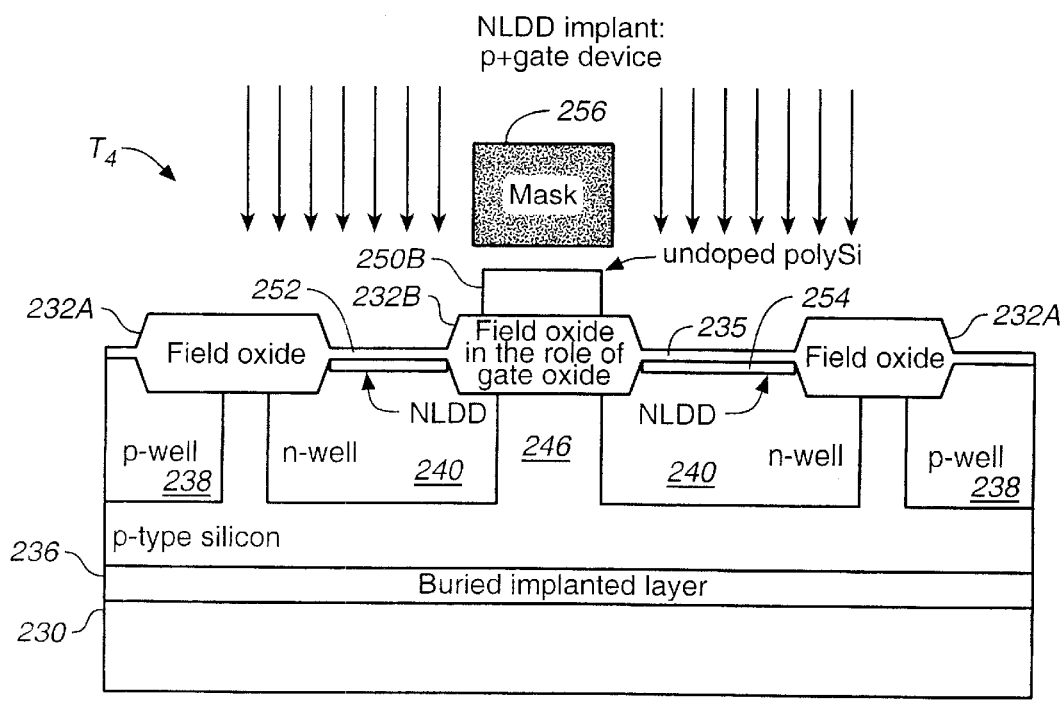
FIG._13B

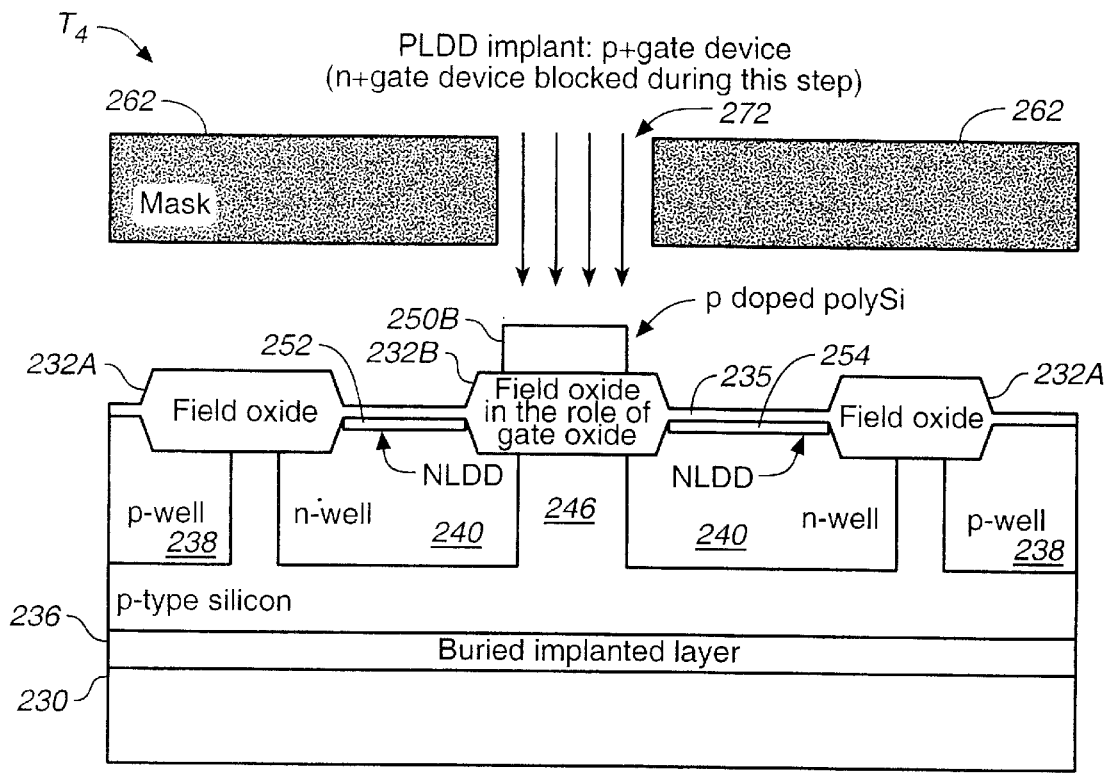
FIG._14
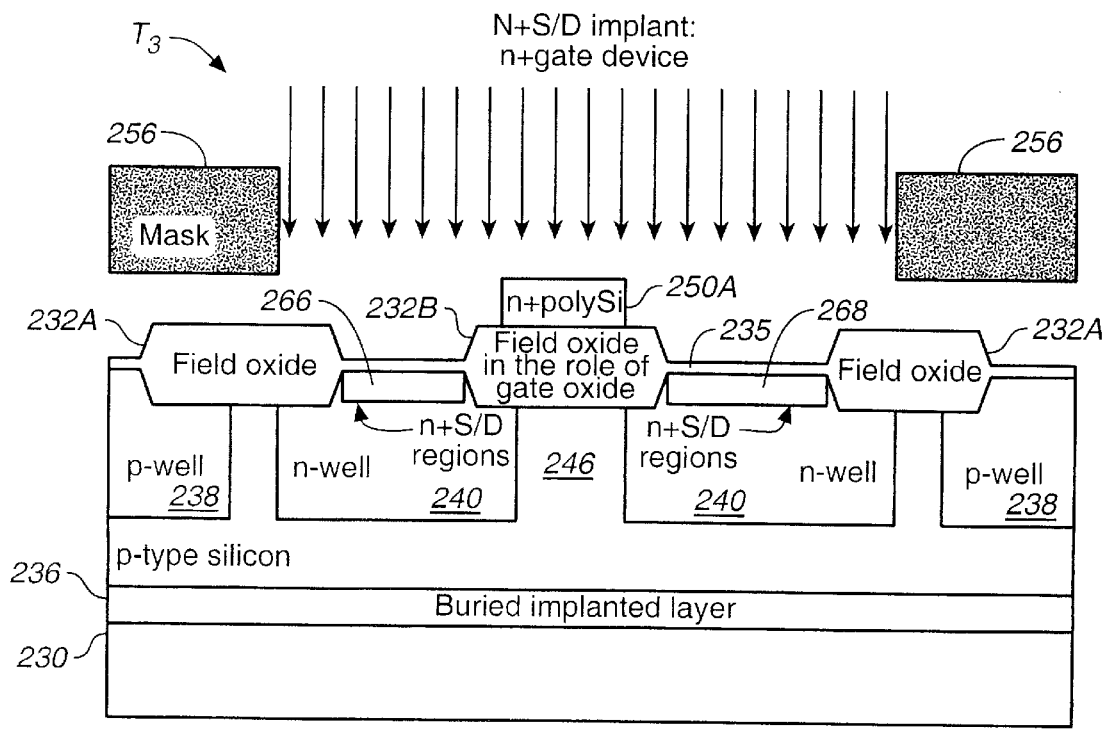
FIG._15A

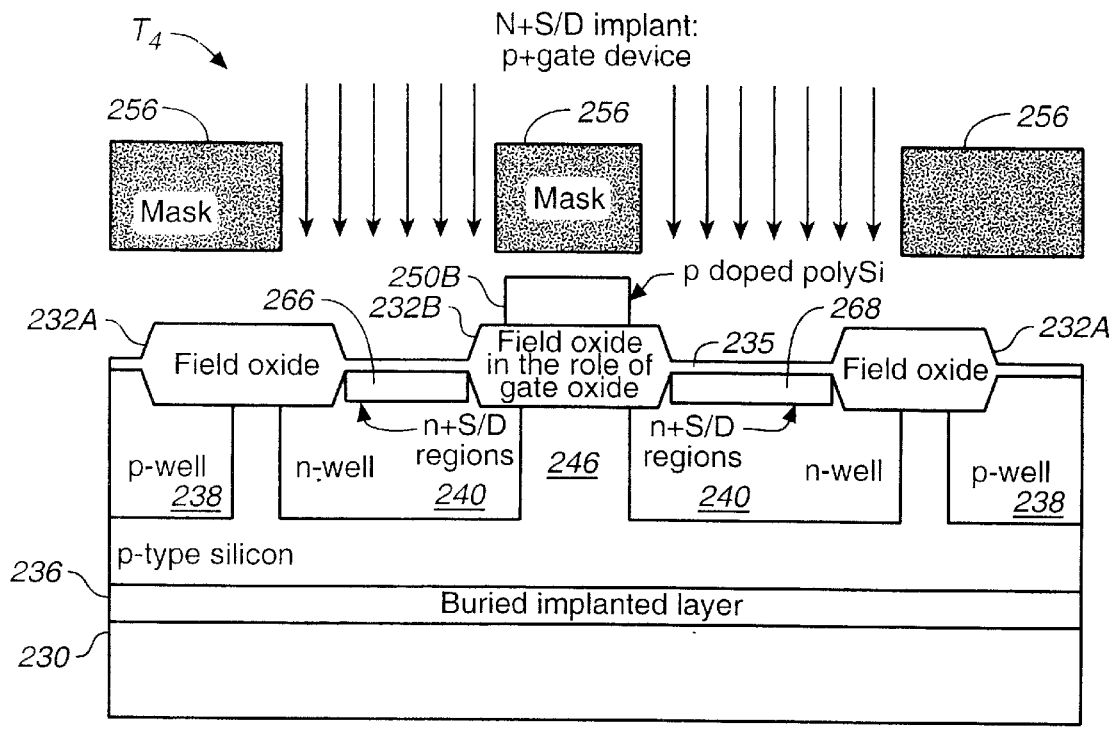
FIG._15B
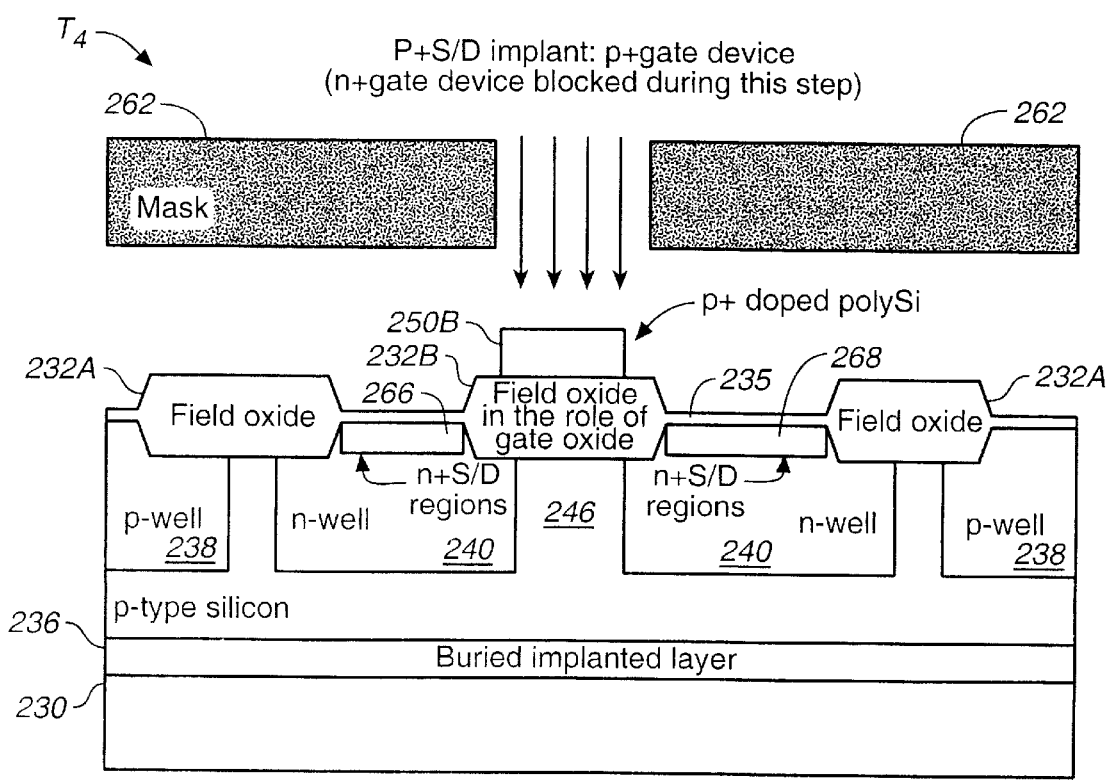
FIG._16

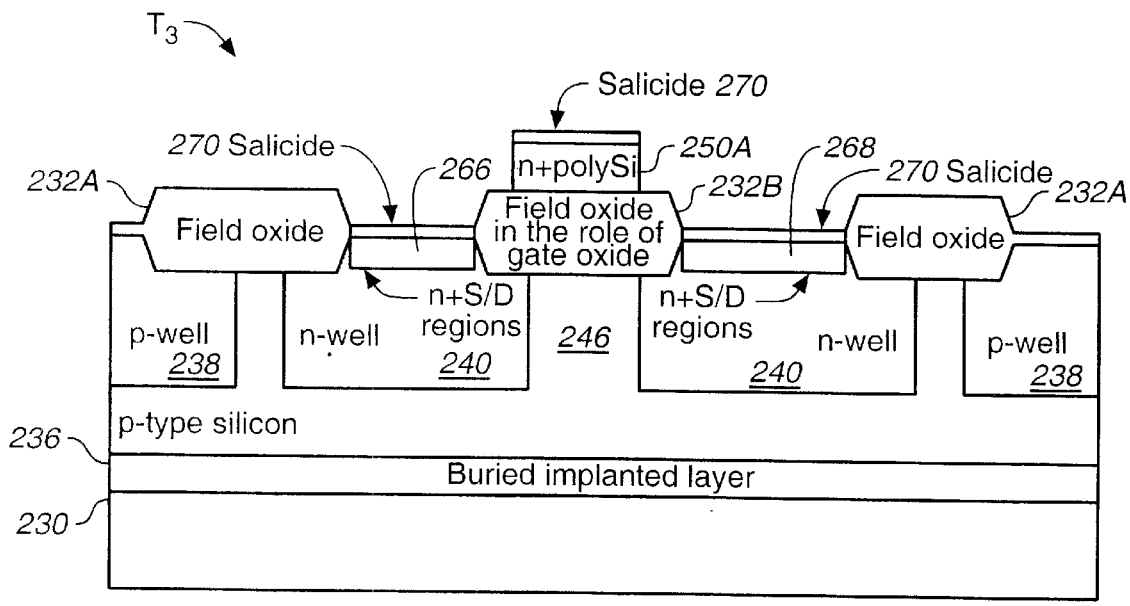
FIG._17A
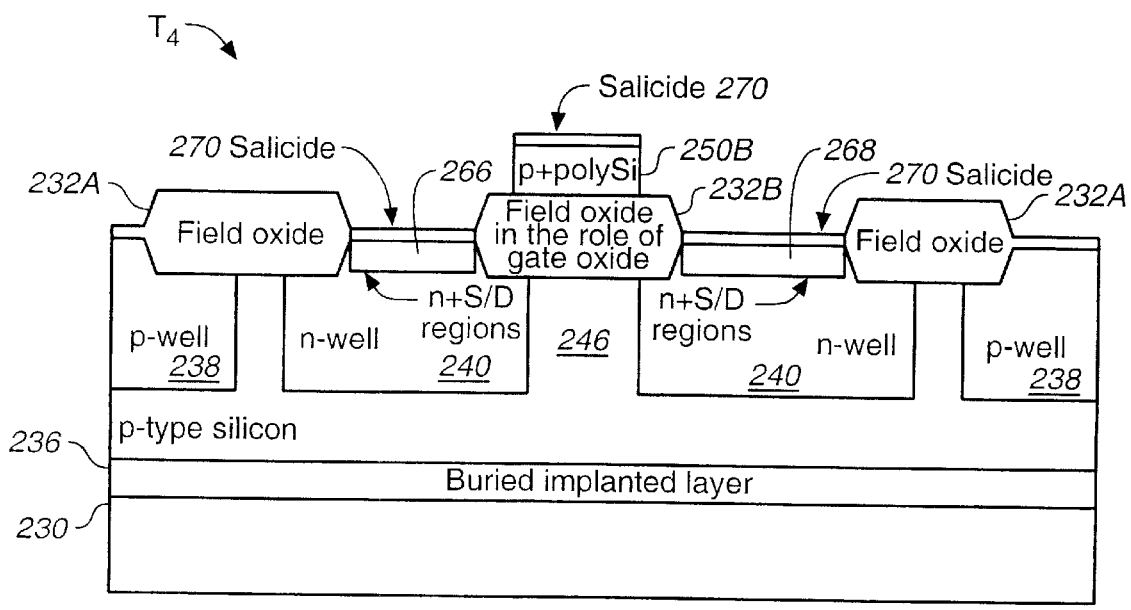
FIG._17B

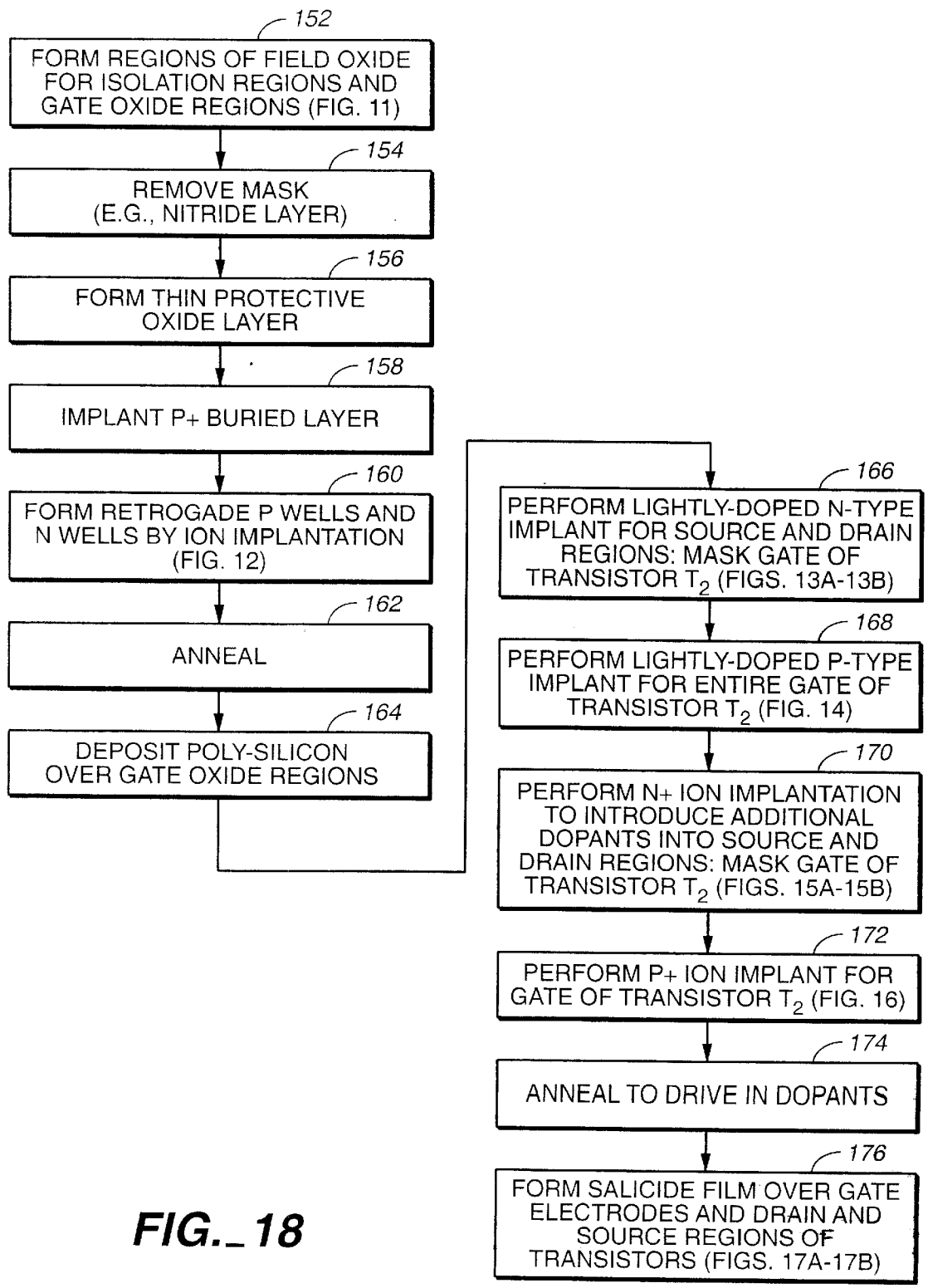
FIG._18

SEMICONDUCTOR DEVICE WITH A PAIR OF TRANSISTORS HAVING DUAL WORK FUNCTION GATE ELECTRODES

BACKGROUND

The present invention relates generally to semiconductor devices and, in particular, to devices with a pair of transistors having dual work function gate electrodes.

Various electronic devices, including digital-to-analog converters, operational amplifiers, and instrumentation amplifiers, require an accurate and stable voltage source to function properly. In particular, the voltage sources should be insensitive to changes in the ambient environment, such as changes in supply voltage or temperature.

Various techniques are known for providing a reference voltage source. In theory, a reference voltage can be generated using a pair of field-effect transistors (FETS) which are identical except for their gate electrode work functions. The different work functions results in corresponding different threshold voltages which can be used to provide the reference voltage.

FIG. 1 shows a simplified circuit, consisting of two metal-oxide-semiconductor (MOS) transistors $T_1$ and $T_2$ operating in the saturation region. The transistors $T_1$, $T_2$ are identical except for the values of their respective threshold voltages, which are achieved by providing the polysilicon gate electrodes of the transistors with different doping types. In other words, the gate electrode of one transistor, for example, the transistor $T_1$, has a n-type conductivity, and the gate electrode of the second transistor $T_2$ has a p-type conductivity. The threshold voltage of a MOS transistor can be expressed as $$V_T = V_{FB} + 2\varphi_{P-} + \frac{\sqrt{2\epsilon_s N_d 2(\varphi_p)}}{C_{ox}},$$

where $V_{FB}$ is the flat band voltage of the MOS structure, $\phi_p$ is the bulk potential, $N_d$ is the concentration of dopants in the channel, and $C_{ox}$ is the gate capacitance per unit area. The flat band voltage $V_{FB}$ is determined by the work function difference $\phi_{MS}$ between the gate material and semiconductor material in the channel region, and also by the charge residing at the interface states and within the gate oxide. The work function difference $\phi_{MS}$ corresponds to the difference between polysilicon and bulk Fermi levels. A polysilicon layer, used as the gate electrode, is heavily doped and, therefore, the Fermi level is effectively pinned at the conduction or valence band edges for N+ and P+ type polysilicon, respectively.

If the two transistors $T_1$, $T_2$ are formed using the same process flow such that the only difference between them is the polysilicon doping, the threshold voltage difference, $V_{T1}-V_{T2}$, would be identical to the work function difference between the bulk silicon, and N+ poly and P+ poly, respectively. In such a situation, the work function difference $\phi_{MS}$ of the N+ oxide-silicon and P+ oxide-silicon systems would differ by the value of the energy band gap of silicon (approximately 1.11 eV at room temperature). Accordingly, the threshold voltage difference also would be close to that value, regardless of the channel doping, gate oxide thickness and interface properties.

As shown in FIG. 1, drain D of each transistor is electrically coupled to its respective gate G. Thus, for each transistor $T_1$, $T_2$, the gate-to-source voltage $V_{GS}$ equals the drain-to-source voltage $V_{DS}$. Therefore, both transistors operate in the saturation regime, and their drain currents can be expressed as $$I_{DS}=\beta/2(V_{GS}-V_T)^2$$

where $$\beta=W/L\, C_{ox}\mu;$$

W, L are the gate width and length respectively, $\mu$ is the carrier mobility in the channel, and $C_{ox}$ is the capacitance of gate oxide per unit area. Transistors such as those shown in FIG. 1 which are substantially identical except for the value of their respective threshold voltages are sometimes referred to as $\beta$-identical transistors.

Also, in the circuit shown in FIG. 1, the drain currents $I_{D1}$, $I_{D2}$ of the transistors $T_1$, $T_2$ are substantially identical. Substantially identical drain currents can be achieved by using a current mirror in the drain of each transistor. The difference in the respective drain-to-source voltages $\Delta V_{DS}$ ($=V_{DS1}-V_{DS2}$) equals the difference in threshold voltages $V_{T1}-V_{T2}$. The voltage difference $\Delta V_{DS}$ is not dependent on the drain current or the supply voltage. The temperature dependence of $\Delta V_{DS}$ is controlled primarily by the temperature dependence of the silicon band gap, which is approximately 0.3 mV/K. Thus, the voltage difference $\Delta V_{DS}$ can be used as a relatively stable voltage source.

Various devices have been proposed using pairs of FETs to generate a reference voltage source. However, many of the proposed devices are difficult to implement using standard CMOS technology and fabrication flow processes. Moreover, in some designs for a reference voltage with a pair of $\beta$-identical transistors, at least a portion of one of the polysilicon gates above the channel region of the transistor has a different conductivity type than a central portion of the gate. As a result, the central portion of the transistor gate is shorter than the channel length of the transistor. Such a design effectively results in two additional transistors in series with the central transistor which can lead to the output reference voltage being dependent on the drain current.

SUMMARY

In general, techniques are described for fabricating a pair of transistors which more closely approximate ideal $\beta$-identical transistors, in other words, a pair of transistors whose dimensions and electrical characteristics, other than their respective gate electrode work functions, are substantially similar. The techniques described in greater detail below can be incorporated into a standard CMOS process and can help avoid some of the problems discussed above. The techniques, however, are not limited to the formation of precisely $\beta$-identical transistors or to the use of CMOS processes.

In one particular aspect, a semiconductor device includes a substrate of a first conductivity type and a pair of field effect transistors formed in the substrate. Each transistor includes source and drain regions of a second conductivity type opposite the first conductivity type and a channel region. An area extending from the source region to the drain region defines a length of the channel. Each transistor also includes a gate electrode disposed above the channel region. The gate electrode of a first one of the transistors is of the second conductivity type. A portion of the gate electrode of the second one of the transistors is of the first conductivity type and extends above the entire length of the channel of the second transistor. The lengths of the channels of the first and second transistors are substantially the same.

In another aspect, a semiconductor device includes a substrate of a first conductivity type and a pair of field effect transistors formed in the substrate. Each transistor includes source and drain regions of a second conductivity type opposite the first conductivity type and a channel region. An area extending from the source region to the drain region defines a length of the channel. Each transistor also includes a gate electrode disposed above the channel region and a field oxide region disposed between the gate electrode and the channel region. The gate electrode of a first one of the transistors has a first work function and includes dopants only of the first type of conductivity. The gate electrode of the second one of the transistors has a second work function and includes dopants only of the second type of conductivity. The lengths of the channels of the first and second transistors are substantially the same.

Such devices can be used to form, for example, a reference voltage source and can be incorporated into digital-to-analog converters, operational amplifiers, instrumentation amplifiers, and other electronic devices requiring an accurate and stable voltage source.

Techniques for fabricating such devices also are described below.

Some implementations include one or more of the following advantages. The technique allows CMOS technology to be used to fabricate a pair of FET transistors which are substantially identical except for the doping of their respective gates. The use of CMOS technology allows the formation of β-identical transistors to be integrated easily into standard device and circuit fabrication processes with few, if any, modifications. Moreover, the present invention permits two transistors to be fabricated in a manner that more closely approximates ideal β-identical transistors. The present invention can, therefore, provide a stable reference voltage source that exhibits reduced dependence on the drain current of the transistors. A reference voltage source also can be fabricated that exhibits less dependence on temperature.

Other features and advantages will be readily apparent from the following detailed description, the accompanying drawings and the claims.

BRIEF DESCRIPTION OF THE DRAWINGS

FIG. 1 is a circuit diagram of a reference voltage source using dual work function polysilicon gate MOS transistors.

FIGS. 2–10 illustrate a first embodiment of the invention in which:

FIG. 2 is a cross-section of a device (n-type or p-type gate) during formation of a buried implant layer.

FIG. 3 is a cross-section of a device (n-type or p-type gate) during performance of a p-well implant.

FIG. 4 is a cross-section of a device (n-type or p-type gate) during performance of an n-well implant.

FIG. 5A is a cross-section of a device (n-type gate) during performance of a lightly-doped n-type implant.

FIG. 5B is a cross-section of a device (p-type gate) during performance of the lightly-doped n-type implant.

FIG. 6 is a cross-section of a device (p-type gate) during performance of a lightly-doped p-type implant.

FIG. 7A is a cross-section of a device (n-type gate) during performance of an n+ drain/source implant.

FIG. 7B is a cross-section of a device (p-type gate) during performance of the n+ drain/source implant.

FIG. 8 is a cross-section of a device (p-type gate) during performance of a p+ implant.

FIG. 9A is a cross-section of a device (n-type gate) following formation of a salicide layer.

FIG. 9B is a cross-section of a device (p-type gate) following formation of the salicide layer.

FIG. 10 is a flow chart showing steps of forming a device according to the first embodiment of the invention.

FIGS. 11–18 illustrate a second embodiment of the invention in which:

FIG. 11 is a cross-section of a device (n-type or p-type gate) during formation of a buried implant layer.

FIG. 12 is a cross-section of a device (n-type or p-type gate) during performance of an n-well implant.

FIG. 13A is a cross-section of a device (n-type gate) during performance of a lightly-doped n-type implant.

FIG. 13B is a cross-section of a device (p-type gate) during performance of the lightly-doped n-type implant.

FIG. 14 is a cross-section of a device (p-type gate) during performance of a lightly-doped p-type implant.

FIG. 15A is a cross-section of a device (n-type gate) during performance of an n+ drain/source implant.

FIG. 15B is a cross-section of a device (p-type gate) during performance of the n+ drain/source implant.

FIG. 16 is a cross-section of a device (p-type gate) during performance of a p+ implant.

FIG. 17A is a cross-section of a device (n-type gate) following formation of a salicide layer according to the invention.

FIG. 17B is a cross-section of a device (p-type gate) following formation of the salicide layer according to the invention.

FIG. 18 is a flow chart showing steps of forming a device according to the second embodiment of the invention.

DETAILED DESCRIPTION

A technique that uses CMOS technology to fabricate a pair of β-identical transistors is now described with respect to FIGS. 2–10. The process can be used to provide a pair of FET transistors which are substantially similar except for the doping of their respective gates. Specifically, a first transistor $T_1$ has a gate electrode which is n-type, whereas a second transistor $T_2$ has a gate electrode which is p-type. The electrical properties of the channels of the two transistors, as well as the respective dimensions of the channels, are substantially similar.

In one implementation, as shown in FIG. 2, isolation regions of field oxide 32 are formed in a p-type silicon substrate 30 (FIG. 10, step 102). The field oxide regions 32 can be formed, for example, using a local silicon oxidation process in which a silicon nitride layer is used to mask the areas of the substrate 30 which will serve as active regions where the transistors $T_1$, $T_2$ are formed. Referring to FIG. 2, the area of the substrate between the pair of field oxide regions 32 serves as the active region for a single transistor. Thus, the substrate 30 includes at least one additional such area in which to form a second transistor. Once the field oxide regions 32 are formed, the nitride layer is removed (step 104), and a thin protective or screening oxide layer 34 is formed (step 106). Next, a p+ buried layer 36 is implanted in the substrate 30 (step 108). Once the buried layer 36 is formed, the cross-section corresponding to each of the transistors $T_1$, $T_2$ appears as shown in FIG. 2.

Retrograde p-type wells 38 (FIG. 3) and n-type wells 40 (FIG. 4) then are formed in the substrate 30 by ion implantation (steps 110, 112). During formation of the p-type wells 38, a mask 42 is used, whereas during formation of the n-type wells 40, a different mask 44 is used. In general, the masks 42, 44 can be photolithographic masks, photoresist masks, or combinations of both. Areas between the p-type wells 38 define regions for the formation of the transistors. The n-type wells 40 serve, respectively, as drain and source regions for the transistors which are subsequently formed. The area between the n-type wells in the active region of the substrate 30 serves as the channel region 46 for one of the transistors. Thus, the n-type wells 40 in a particular active region extend toward each other to define the channel region 46, with the distance between the n-type wells 40 defining the channel length of the transistor. The position of the wells 38, 40 can be modulated vertically to reduce the Dt product (i.e., the diffusion constant multiplied by the diffusion time) and to improve the definition of well edges.

Following an annealing process to activate the implanted dopants (step 114), the screening oxide layer 34 is removed, and a gate oxide 48 is formed over the active regions of each transistor $T_1$, $T_2$ (step 116). Poly-crystalline silicon (poly-Si) is deposited over a portion of the active region of each transistor (step 118) to form a respective gate 50A, 50B for each transistor (see FIGS. 5A, 5B). Each poly-Si gate 50A, 50B overlaps an entire channel region 46 and partially overlaps the respective n-type wells 40 previously formed in the substrate 30. As will become evident, that layout allows the entire portion of the poly-Si gate 50B that lies above the channel region 46 to be implanted with p-type dopants without affecting the source and drain regions of the transistor $T_2$.

The fabrication process of the transistors $T_1$ and $T_2$ is the same through the step of depositing the poly-Si (step 118). Thus, the lengths of the channels 46 for the respective transistors $T_1$, $T_2$ are substantially the same. Next, a lightly-doped n-type (NLDD) implant is performed to provide doped sections 52, 54 (FIGS. 5A, 5B) in the source and drain regions 40 of the transistors $T_1$, $T_2$ (step 120). During the NLDD implant, the n-type dopants penetrate into sections 52, 54 of both transistors $T_1$, $T_2$. A mask 56, however, prevents the n-type dopant from penetrating a central portion 58 of the gate 50B of the transistor $T_2$. Specifically, the mask 56 prevents the n-type dopant from penetrating at least the entire portion 48 of the gate 50B which overlaps the channel region 46 of the transistor $T_2$. This guarantees that the conductive properties of the channels 46 for both transistors $T_1$, $T_2$ are substantially similar. The edges 60 of the gate 50B above the drain and source regions 40, however, need not be covered by the mask 56 and, therefore, n-type dopants may be implanted therein. Similarly, the mask 56 does not prevent the n-type dopant from penetrating the gate 50A of the transistor $T_1$. Accordingly, after the NLDD implant (step 120), the poly-Si gate 50A will be lightly n-type doped.

Following the lightly-doped n-type implant to form the sections 52, 54 of the source and drain regions 40, a lightly-doped p-type (PLDD) implant is performed (step 122). During the PLDD implant, a photoresist mask 62 (FIG. 6) is used. The photoresist mask 62 covers most of the transistor $T_2$, except for the central portion 58 of the gate 50B. Thus, the central portion 58 of the poly-Si gate 50B, which extends over the entire length of the channel 46, is lightly implanted with p-type dopant. The transistor $T_1$ (not shown in FIG. 6) is covered completely by the photoresist mask 62 during the PLDD implant to prevent penetration of the p-type dopant.

During subsequent processing, spacers 64 (see FIGS. 7A, 7B) are formed adjacent the edges of the poly-Si gates 50A, 50B through oxide deposition and etching (step 124). Next, an n+ ion implantation (S/D implant) is performed (step 126) to introduce additional n-type dopants into the source and drain regions of both transistors $T_1$, $T_2$ and into the poly-Si gate 50A of transistor $T_1$. The mask 56 previously used during the NLDD process also can be used during the n+ S/D implant step. Thus, n+ regions 66, 68 (FIGS. 7A, 7B) are formed in the source and drain regions 40 of the transistors $T_1$, $T_2$. The gate 50A of the transistor $T_2$ also is implanted with n-type dopants. As before, however, the mask 56 prevents the n-type dopants from penetrating into the central portion 58 of the gate 50B of the transistor $T_2$ (FIG. 7B). If the substrate 30 will include additional NMOS transistors, then the n+ S/D implant can be performed during formation of the drain and source regions for the NMOS transistors.

Following the n+ S/D implant, a p+ ion implant is performed (step 128). The mask 62 previously used during the PLDD process also can be used during the p+ S/D implant. Thus, during the p+ S/D implant, most of the transistor $T_2$ is masked, except for the central portion 58 of the poly-Si gate 50B, thereby allowing additional p-type dopants to be implanted into the central portion 58 of the poly-Si gate 50B (FIG. 8). The transistor $T_1$ (not shown in FIG. 8) is covered completely with the mask 62 during the p+ S/D implant to prevent penetration of the p-type dopant. Following the p+ ion implant, an anneal process is performed to activate the dopants (step 130).

A salicide film 70 (FIGS. 9A, 9B) is then deposited over the gate electrodes 50A, 50B as well as over the n+ source and drain regions 66, 68 (step 132). The conductive salicide layer 70 over the gate 50B ensures good electrical contact between the p+ doped central portion 58 and the n+ doped edges 60. As can be seen from FIGS. 9A, 9B, the transistors $T_1$, $T_2$ are substantially identical except for the doping of their respective gates 50A, 50B. In particular, the dimensions of the channels 46, including their respective lengths as defined by the n-type wells 40, are substantially the same for both transistors $T_1$, $T_2$. Similarly, the conductive properties of the channels for both transistors $T_1$, $T_2$ are substantially the same because the p+ doped central portion 58 of the gate 50B extends partially over the n-type well extensions 40 of the source and drain regions (FIG. 9B). As a result, the p+ doped central portion 58 of the gate 50B of transistor $T_1$ is at least as long as the channel 46 and extends over the entire length of the channel 46.

Additional processing of the transistors $T_1$, $T_2$, including metallization, can be performed so that the pair of transistors are connected, for example, as shown in FIG. 1 to form a reference voltage source. Alternatively, the pair of transistors $T_1$, $T_2$ can be connected in other ways or in other circuits to provide reference voltage sources other than the one shown in FIG. 1.

An alternative technique that uses CMOS technology to fabricate a pair of β-identical transistors is now described with respect to FIGS. 11–18. This process also results in a pair of FET transistors which are substantially similar except for the doping of their respective gates. Specifically, a first transistor $T_3$ has a gate which is n-type, whereas a second transistor $T_4$ has a gate which is p-type.

As shown in FIG. 11, regions of field oxide 232A, 232B are formed in a p-type silicon substrate 230 (FIG. 18, step 152). The field oxide regions 232A, 232B can be formed, for example, using a local silicon oxidation process in which a silicon nitride layer is used to mask the areas of the substrate 230 which will serve as active regions where the transistors $T_3$, $T_4$ are formed. Referring to FIG. 11, the area of the substrate between the field oxide regions 232A serves as the active region for a single transistor, with the field oxide region 232B serving as the gate oxide. Once the field oxide regions 232A, 232B are formed, the nitride layer is removed (step 154), and a thin protective or screening oxide layer 234 is formed (step 156). Next, a p+ buried layer 236 is implanted in the substrate 230 (step 158). Once the buried layer 236 is formed, the cross-section corresponding to each of the transistors $T_3$, $T_4$ appears as shown in FIG. 11.

Retrograde p-type wells 238 and n-type wells 240 (FIG. 4) are formed in the substrate 230 by ion implantation (step 160) in a manner similar to that described above with respect to FIGS. 3 and 4. The same photolithographic or photoresist masks used during formation of the p-type and n-type wells 38, 40 in the first embodiment can be used during formation of the p-type and n-type wells 238, 240 (see e.g., FIG. 12). Areas between the p-type wells 238 define regions for the formation of the transistors $T_3$, $T_4$. The n-type wells 240 serve, respectively, as drain and source regions for the transistors which are subsequently formed. The area between the n-type wells 240 in the active region of the substrate 230 serves as the channel region 246 for one of the transistors. Thus, the n-type wells 240 in a particular active region extend toward each other to define the channel region 246, with the distance between the n-type wells 240 defining the channel length of the transistor. The position of the wells 238, 240 can be modulated vertically to reduce the Dt product (i.e., the diffusion constant multiplied by the diffusion time) and to improve the definition of well edges.

Following an annealing process to activate the implanted dopants (step 162). If a standard CMOS process is used, the screening oxide 234 is stripped and a new oxide layer 235 is grown in its place. Next, poly-Si is deposited over a central portion of the gate oxide 232B (step 164) to form a gate 250A, 250B for each transistor (see FIGS. 13A, 13B). The edges of the thick gate oxide 232B extend laterally beyond the respective edges of the poly-Si gates 250A, 250B toward the associated source and drain regions. As will become evident, that feature makes it possible to dope the entire gate 250B of the transistor $T_4$ with p-type dopants. Each poly-Si gate 250A, 250B should extend above the entire length of a channel region 246 to help reduce adverse effects of alignment errors.

The fabrication process of the transistors $T_3$ and $T_4$ is the same through the step of depositing the poly-Si (step 164). Next, a lightly-doped n-type (NLDD) implant is provided to form sections 252, 254 for the source and drain regions 240 (FIGS. 13A, 13B) of the transistors $T_3$, $T_4$ (step 166). During the NLDD implant, the n-type dopants penetrate into the source and drain regions 240 of both transistors $T_3$, $T_4$. A mask 256, however, covers the poly-Si gate 250B to prevent the n-type dopant from penetrating the gate of the transistor $T_4$. The mask 256 does not prevent the n-type dopant from penetrating the gate 250A of the transistor $T_3$. Accordingly, after the NLDD implant (step 166), the poly-Si gate 250A may be lightly n-type doped.

Following the lightly-doped n-type implant for the source and drain regions 240, a lightly-doped p-type (PLDD) implant is performed (step 168). During the PLDD implant, a photoresist mask 262 (FIG. 14) is used. The photoresist mask 262 covers most of the transistor $T_4$, except for the gate 250B of the transistor $T_4$. Thus, the entire poly-Si gate 250B, which extends over the length of the channel 246, is lightly implanted with p-type dopant. Moreover, the width of the opening 272 in the implant mask 262 corresponding to the gate 250B can be slightly larger than the width of the gate to ensure that the p-type dopants are implanted throughout the gate, even near its edges. Any dopants introduced by ion implantation just beyond the edges of the poly-Si gate 250B will be trapped in the field oxide 232B prior to reaching the silicon substrate 230. The transistor $T_3$ (not shown in FIG. 14) is covered completely by the photoresist mask 262 during the PLDD implant to prevent penetration of the p-type dopant.

Following the NLDD and PLDD implants, an n+ ion implantation (S/D implant) is performed (step 170) to introduce additional n-type dopants into the source and drain regions 240 of both transistors $T_3$, $T_4$ and into the poly-Si gate 250A of transistor $T_3$. The mask 256 previously used during the NLDD process also can be used during the n+ S/D implant step. Thus, n+ regions 266, 268 (FIGS. 15A, 15B) are formed in the source and drain regions 240 of the transistors $T_3$, $T_4$. The gate 250A of the transistor $T_3$ is implanted with n-type dopants. As before, however, the mask 256 prevents the n-type dopants from penetrating into the gate 250B of the transistor $T_4$ (FIG. 15B). If the substrate 230 will include additional NMOS transistors, then the n+ S/D implant can be performed during formation of the drain and source regions for the NMOS transistors.

Following the n+ S/D implant, a p+ ion implant is performed (step 172). The mask 262 previously used during the PLDD process also can be used during the p+ S/D implant. Thus, during the p+ S/D implant, the entire poly-Si gate 250B, which extends over the length of the channel 246, is implanted with additional p-type dopants. Since the width of the opening 272 in the mask 262 is slightly larger than the width of the gate 250B, the p-type dopants are implanted throughout the gate, even near its edges. Any dopants introduced by during the ion implantation just beyond the edges of the poly-Si gate 250B will be trapped in the field oxide 232B prior to reaching the silicon substrate 230. The transistor $T_3$ (not shown in FIG. 16) is covered completely by the photoresist mask 262 during the PLDD implant to prevent penetration of the p-type dopant. Following the p+ ion implant, an anneal process is performed to activate the dopants (step 174). If the substrate 230 will include additional PMOS transistors, then the p+ S/D implant can be performed during formation of the drain and source regions for the PMOS transistors.

A salicide film 270 (FIGS. 17A, 17B) is then deposited over the gate electrodes 250A, 250B as well as over the n+ source and drain regions 266, 268 (step 176). As can be seen from FIGS. 17A, 17B, the transistors $T_3$, $T_4$ are substantially identical except for the doping of their respective gates 250A, 250B. In particular, the dimensions of the channels 246, including their respective lengths as defined by the n-type wells 240, are substantially the same for both transistors $T_3$, $T_4$. Similarly, the conductive properties of the channels for both transistors $T_3$, $T_4$ are substantially the same.

Additional processing of the transistors $T_3$, $T_4$, including metallization, can be performed so that the pair of transistors are connected to form the reference voltage source of FIG. 1, with the transistors $T_3$, $T_4$ replacing the transistors $T_1$, $T_2$, respectively. Alternatively, the pair of transistors $T_3$, $T_4$ can be connected in other ways or in other circuits to provide reference voltage sources other than the one shown in FIG. 1.

In the implementations described above, the transistors are formed on p-type silicon having a buried implant layer 36 or 236. In other embodiments, however, the buried implant is not necessary, and the transistors can be formed, for example, on a p-type epitaxial layer formed on a p+ semiconductor substrate.

Other implementations are within the scope of the following claims.

What is claimed is:

1. A semiconductor device comprising:
a substrate of a first conductivity type;
a pair of field effect transistors formed in the substrate, wherein each transistor includes:
(a) source and drain regions of a second conductivity type opposite the first conductivity type, wherein the source and drain regions include well-extension regions;
(b) a channel region, wherein an area extending from the source region to the drain region defines a length of the channel; and
(c) a gate electrode disposed above the channel region;
wherein the gate electrode of a first one of the transistors is of the second conductivity type, wherein a portion of the gate electrode of the second one of the transistors is of the first conductivity type and extends above the entire length of the channel of the second transistor, and wherein the lengths of the channels of the first and second transistors are substantially the same.

2. The device of claim 1 wherein each gate electrode extends partially above its associated source and drain regions.

3. The device of claim 1 wherein the gate electrode of the second transistor includes a central portion and edges adjacent the central portion, wherein the central portion is of the first conductivity type and extends above the entire length of the channel of the second transistor, and wherein the edges are of the second conductivity type and are disposed above the source and drain regions of the second transistor.

4. A semiconductor device comprising:
a substrate of a first conductivity type;
a pair of field effect transistors formed in the substrate, wherein each transistor includes:
(a) source and drain regions of a second conductivity type opposite the first conductivity type;
(b) a channel region, wherein an area extending from the source region to the drain region defines a length of the channel; and
(c) a gate electrode disposed above the channel region;
wherein the gate electrode of a first one of the transistors is of the second conductivity type, wherein a portion of the gate electrode of the second one of the transistors is of the first conductivity type and extends above the entire length of the channel of the second transistor, wherein the lengths of the channels of the first and second transistors are substantially the same,
wherein the gate electrode of the second transistor includes a central portion and edges adjacent the central portion, wherein the central portion is of the first conductivity type, extends above the entire length of the channel of the second transistor and extends partially above the source and drain regions of the second transistor, and wherein the edges are of the second conductivity type and are disposed above the source and drain regions of the second transistor.

5. The device of claim 3 further including a salicide layer directly over the gate electrodes.

6. The device of claim 3 further including spacers adjacent the edges of the second gate electrode.

7. The device of claim 1 wherein the gate electrode of the first transistor extends above the entire length of the channel of the first transistor.

8. The device of claim 1 wherein the transistors are β-identical.

9. The device of claim 1 wherein the first conductivity type is p-type and the second conductivity type is n-type.

10. The device of claim 1 wherein the gate electrodes include poly-crystalline silicon.

11. The device of claim 1 formed by a MOS process.

12. A reference voltage source comprising:
a pair of field effect transistors formed in a substrate of a first conductivity type and electrically coupled to one another, wherein each transistor includes:
(a) source and drain regions of a second conductivity type opposite the first conductivity type, wherein the source and drain regions include well-extension regions;
(b) a channel region, wherein an area extending from the source region to the drain region defines a length of the channel; and
(c) a gate electrode disposed above the channel region;
wherein the gate electrode of a first one of the transistors is of the second conductivity type, wherein a portion of the gate electrode of the second one of the transistors is of the first conductivity type and extends above the entire length of the channel of the second transistor, and wherein the lengths of the channels of the first and second transistors are substantially the same.

13. The reference voltage source of claim 12 wherein the first and second transistors have substantially the same drain current.

14. A semiconductor device comprising:
a substrate of a first conductivity type;
a pair of field effect transistors formed in the substrate, wherein each transistor includes:
(a) source and drain regions of a second conductivity type opposite the first conductivity type;
(b) a channel region, wherein an area extending from the source region to the drain region defines a length of the channel;
(c) a gate electrode disposed above the channel region; and
(d) a field oxide region disposed between the gate electrode and the channel region;
wherein the gate electrode of a first one of the transistors has a first work function and includes dopants only of the first type of conductivity, wherein the gate electrode of the second one of the transistors has a second work function and includes dopants only of the second type of conductivity, and wherein the lengths of the channels of the first and second transistors are substantially the same.

15. The device of claim 14 wherein the gate electrode of the second transistor extends over the entire length of the channel of the second transistor.

16. The device of claim 14 wherein the gate electrode of the first transistor extends above the entire length of the channel of the first transistor.

17. The device of claim 14 wherein each field oxide region disposed between an associated gate electrode and one of the channels extends in a lateral direction beyond the associated gate electrode toward the associated source and drain regions.

18. The device of claim 14 wherein the transistors are β-identical.

19. The device of claim 14 wherein the first conductivity type is p-type and the second conductivity type is n-type.

20. The device of claim 14 wherein the gate electrodes include poly-crystalline silicon.

21. The device of claim 14 formed by a MOS process.

22. A reference voltage source comprising:
a pair of field effect transistors formed in a substrate of a first conductivity type and electrically coupled to one another, wherein each transistor includes:

(a) source and drain regions of a second conductivity type opposite the first conductivity type;

(b) a channel region, wherein an area extending from the source region to the drain region defines a length of the channel;

(c) a gate electrode disposed above the channel region; and (d) a field oxide region disposed between the gate electrode and the channel region;

wherein the gate electrode of a first one of the transistors has a first work function and includes dopants only of the first type of conductivity, wherein the gate electrode of the second one of the transistors has a second work function and includes dopants only of the second type of conductivity, and wherein the lengths of the channels of the first and second transistors are substantially the same.

23. The reference voltage source of claim 22 wherein the first and second transistors have substantially the same drain current.

24. The reference voltage source of claim 22 wherein the drain and the gate electrode of the first transistor are connected electrically, and the drain and the gate electrode of the second transistor are connected electrically.

* * * * *